(12) United States Patent
Lee et al.

(10) Patent No.: US 11,509,297 B2
(45) Date of Patent: Nov. 22, 2022

(54) DUTY CYCLE CORRECTION CIRCUIT INCLUDING A REFERENCE CLOCK GENERATOR

(71) Applicants: SK hynix Inc., Icheon (KR); Korea University Research and Business Foundation, Seoul (KR)

(72) Inventors: Minseop Lee, Seoul (KR); Hyunsu Park, Seoul (KR); Jincheol Sim, Seoul (KR); Chulwoo Kim, Seoul (KR)

(73) Assignees: SK hynix Inc., Icheon (KR); Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/517,493

(22) Filed: Nov. 2, 2021

(65) Prior Publication Data

US 2022/0209761 A1 Jun. 30, 2022

(30) Foreign Application Priority Data

Dec. 31, 2020 (KR) .................. 10-2020-0189113

(51) Int. Cl.
*H03K 5/156* (2006.01)
*H03K 5/13* (2014.01)
*H03K 5/00* (2006.01)

(52) U.S. Cl.
CPC ............ *H03K 5/1565* (2013.01); *H03K 5/13* (2013.01); *H03K 2005/00052* (2013.01); *H03K 2005/00078* (2013.01)

(58) Field of Classification Search
None
See application file for complete search history.

(56) References Cited

U.S. PATENT DOCUMENTS 8,487,680 B1 * 7/2013 Chung ................ H03K 5/1565
327/175
9,178,502 B2 11/2015 Francom
(Continued)

FOREIGN PATENT DOCUMENTS

KR 10-2102258 B1 4/2020

OTHER PUBLICATIONS

S.-R. Han and S.-I. Liu, "A 500-MHz-1.25-GHz fast-locking pulse width control loop with presettable duty cycle," IEEE J. Solid-State Circuits, vol. 39, No. 3, pp. 463-468, Oct. 2004.
(Continued)

*Primary Examiner* — Daniel C Puentes

(57) ABSTRACT

A duty cycle correction circuit includes a first duty cycle detecting circuit configured to detect a duty cycle of a clock signal with a first resolution; a reference clock generating circuit configured to generate a reference clock signal by adjusting a phase of the clock signal; a second duty cycle detecting circuit configured to detect a duty cycle of the clock signal with a second resolution according to the reference clock signal and the clock signal, the second resolution being finer than the first resolution; a first duty cycle adjusting circuit configured to adjust the duty cycle of the clock signal according to one or more first control signals output from the first duty cycle detecting circuit; and a second duty cycle adjusting circuit configured to adjust the duty cycle of the clock signal according to one or more second control signals output from the second duty cycle detecting circuit.

20 Claims, 16 Drawing Sheets

(56) References Cited

U.S. PATENT DOCUMENTS 10,218,342 B2 2/2019 Kitagawa
2020/0312399 A1* 10/2020 Brox .................... G11C 11/221

OTHER PUBLICATIONS

Intel Corp, Micron Tech, Phison Electronic corp, Western Digital corp, SK Hynix and Sony corp "Open NAND Flash interface specification revision 4.2" Dec. 2020, pp. 266-268.

Y.-M. Wang and J.-S. Wang, "An all-digital 50% duty-cycle corrector," in Proc. IEEE Int. Symp. Circuits Syst. (ISCAS), May 2004, pp. II-925-II-928.

J. Gu, J. Wu, D. Gu, M. Zhang, and L. Shi, "All-digital wide range precharge logic 50% duty cycle corrector," IEEE Trans. Very Large Scale Integr. (VLSI) Syst., vol. 20, No. 4, pp. 760-764, Apr. 2012.

Dudek, P., Szczepanski, S., Hatfield, J.V. , "A high resolution CMOS time-to-digital converter utilizing a Vernier delay line," IEEE J. Solid-State Circuits, vol. 35, Issue 2, p. 240-247, Feb. 2000.

C.-C. Chung, D. Sheng, and C.-J. Li, "A Wide-Range Low-Cost All-Digital Duty-Cycle Corrector," IEEE Transactions on Very Large Scale Integration (VLSI) Systems, vol. 23, No. 11, pp. 2487-2496, Nov. 2015.

C.H. Jeong, A. Abdullah, Y.J. Min, I.C. Hwang, and S.W. Kim, "All-Digital Duty-Cycle Corrector With a Wide Duty Correction Range for DRAM applications," IEEE Trans. on Very Large Scale Integration (VLSI) Systems, vol. 24, pp. 363-367, Jan. 2016.

B. Razavi, "The current-steering DAC [a circuit for all seasons]," IEEE Solid-State Circuits Mag., vol. 10, No. 1, pp. 11-15, Jan. 2018.

Caro, D.D, "Glitch-free NAND-based digitally controlled delay lines," IEEE Trans. Very Large Scale Integr. (VLSI) Syst., vol. 21, No. 1, pp. 55-66, Jan. 2013.

Youngbog Yoon, Hyunsu Park, and Chulwoo Kim, "A DLL-based Quadrature Clock Generator with a 3-stage Quad Delay Unit using the Sub-range Phase Interpolator for Low-jitter and High-phase Accuracy DRAM Applications," IEEE Trans. Circuits Syst. II, vol. 67, No. 11, p. 2342-2346, Feb. 2020.

K.-T. Kang, S.-Y. Kim, S. J. Kim, D. Lee, S.-S. Yoo, and K.-Y. Lee, "A 0.33-1 GHz Open-Loop Duty Cycle Corrector with Digital Falling Edge Modulator," IEEE Trans. Circuits Syst. II, vol. 65, No. 12, p. 1949-1953, Dec. 2018.

K.-H. Cheng, C.-W. Su, and K.-F. Chang, "A high linearity, fast locking pulse width control loop with digitally programmable duty cycle correction for wide range operation," IEEE J. Solid-State Circuits, vol. 43, No. 2, pp. 399-413, Feb. 2008.

P. Chen, S.-W. Chen, and J.-S. Lai, "A low power wide range duty cycle corrector based on pulse shrinking/stretching mechanism," in Proc. IEEE Asian Solid-State Circuits Conf., Nov. 2007, pp. 460-463.

Young-Jae Min, "A 0.31-1GHz Fast-Corrected Duty-Cycle Corrector With Successive Approximation Register for DDR DRAM Application," Aug. 1, 2012, TVLS.

* cited by examiner

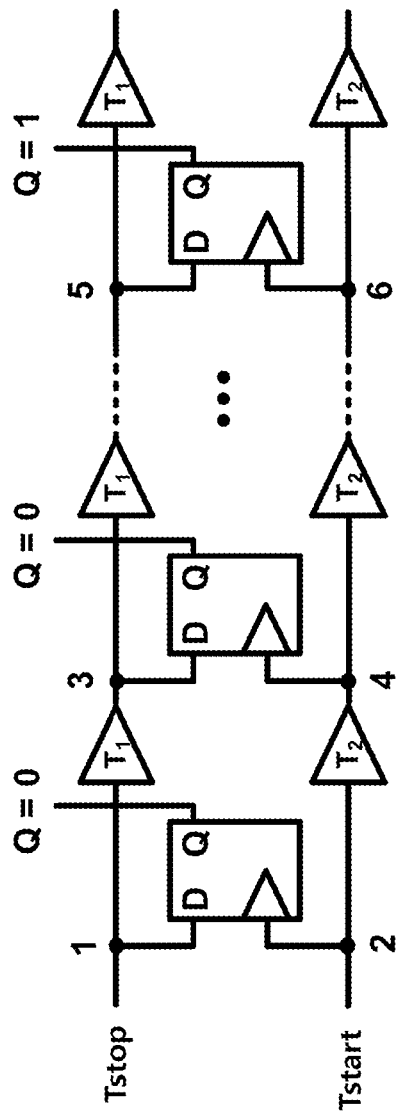
FIG. 1A
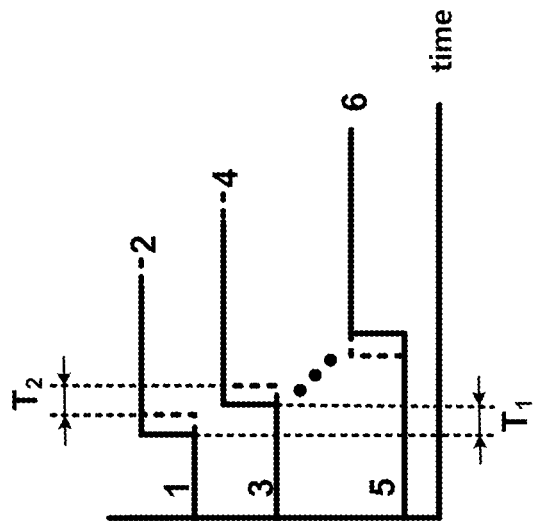
FIG. 1B  <Prior Art>

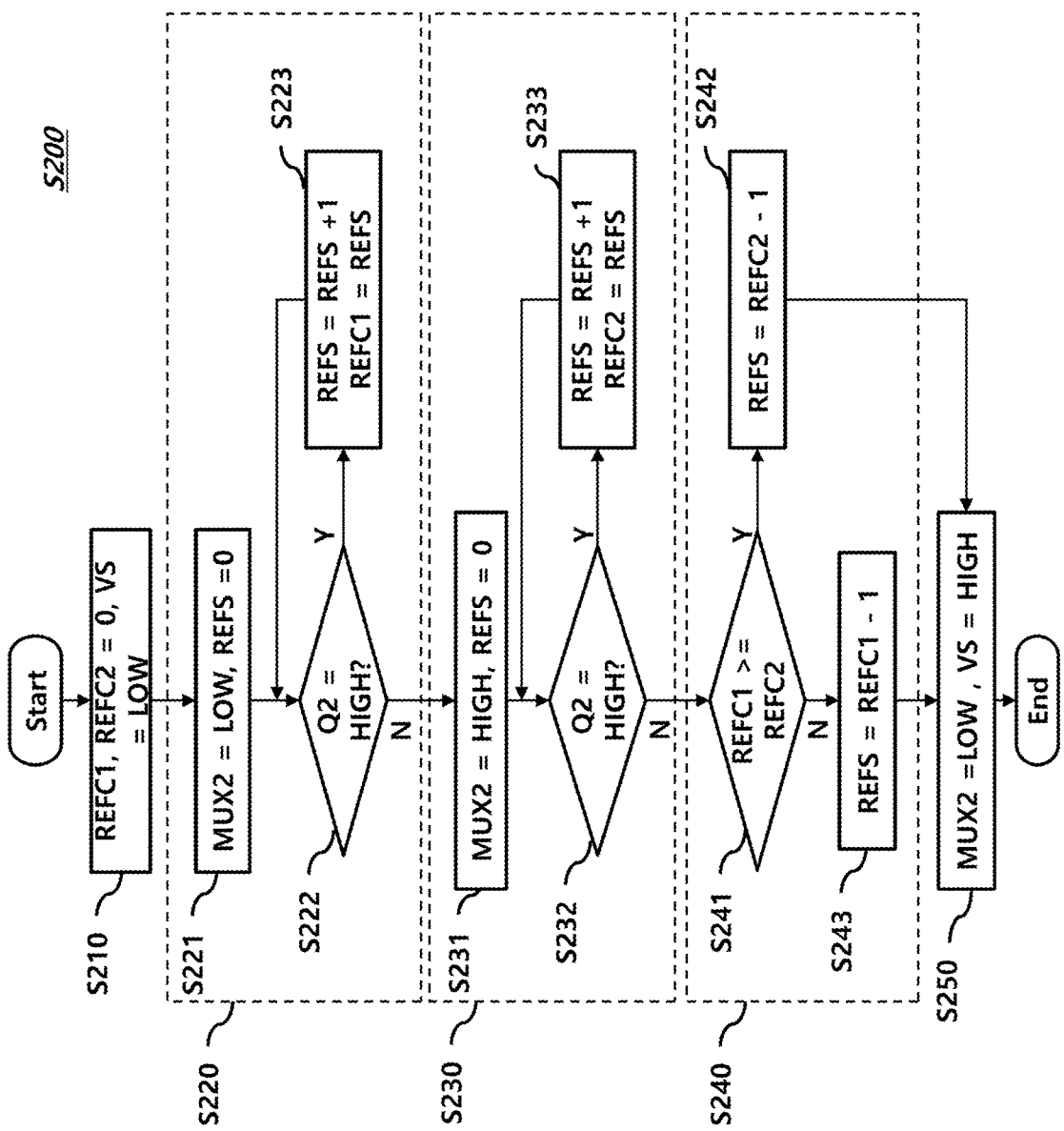

DUTY CYCLE CORRECTION CIRCUIT INCLUDING A REFERENCE CLOCK GENERATOR

CROSS-REFERENCE TO RELATED APPLICATION

The present application claims priority under 35 U.S.C. § 119(a) to Korean Patent Application No. 10-2020-0189113, filed on Dec. 31, 2020, which is incorporated herein by reference in its entirety.

BACKGROUND

1. Technical Field

Various embodiments generally relate to a duty cycle correction circuit including a reference clock generator.

2. Related Art

In a system that transmits data at a relatively high speed, it is important to set a duty cycle to 50% in order to maximize an effective data window.

In this way, a duty cycle correction circuit is used to correct duty cycle.

The duty cycle correction circuit includes a duty cycle adjusting circuit for providing an output clock signal by adjusting a duty cycle of an input clock signal, and a duty cycle detecting circuit for controlling the duty cycle adjusting circuit by detecting a duty cycle of the output clock signal.

A time-to-digital converter (TDC) is used to adjust duty cycle at a relatively high speed.

FIG. 1A is a circuit diagram showing a conventional TDC.

The conventional TDC includes a first delay line in which a plurality of first buffers having a first delay time T1 that are connected in series, and a second delay line in which a plurality of second buffers having a second delay time T2 that are connected in series.

At this time, a difference T1–T2 of the delay times of the two buffers corresponds to a resolution of the TDC.

In addition, the conventional TDC includes a plurality of flip-flops corresponding to the first buffer and the second buffer.

Each flip-flop generates an output signal Q by latching a signal of the corresponding node of the first delay line in synchronization with the signal of the corresponding node of the second delay line.

For example, the first flip-flop generates an output signal by latching a signal of node 1 in synchronization with a signal of node 2, and the second flip-flop latches a signal of node 3 in synchronization with a signal of node 4 to generate an output signal.

Accordingly, the TDC provides a phase difference between the clock signal Tstop applied to the first delay line and the clock signal Tstart applied to the second delay line as the multi-bit output signal Q.

FIG. 1B shows waveforms of clock signals at each node.

In FIG. 1B, solid lines indicate signal waveforms at nodes 1, 3, and 5 in order, and dotted lines indicate signal waveforms at nodes 2, 4, and 6 in order.

As shown, a signal of node 3 has a delay of T1 compared to a signal of node 1, and a signal of node 4 has a delay of T2 compared to a signal of node 2.

In the conventional TDC, a mismatch in a delay amount between a plurality of buffers such as the first buffer and the second buffer tends to occur, and accordingly, it is difficult to accurately detect a duty cycle.

In addition, it may be necessary to add a separate synchronous delay line to compensate for a delay amount of the second buffer.

In addition, the hardware cost required to implement the TDC increases as a resolution enhances, as a period of the clock signal increases, or as a range of an initial duty cycle of the input clock signal increases.

SUMMARY

In accordance with an embodiment of the present disclosure, a duty cycle correction circuit may include a first duty cycle detecting circuit configured to detect a duty cycle of a clock signal with a first resolution; a reference clock generating circuit configured to generate a reference clock signal by adjusting a phase of the clock signal; a second duty cycle detecting circuit configured to detect the duty cycle of the clock signal with a second resolution according to the reference clock signal and the clock signal, the second resolution being finer than the first resolution; a first duty cycle adjusting circuit configured to adjust the duty cycle of the clock signal according to one or more first control signals output from the first duty cycle detecting circuit; and a second duty cycle adjusting circuit configured to adjust the duty cycle of the clock signal according to one or more second control signals output from the second duty cycle detecting circuit.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

FIGS. 1A and 1B illustrate a conventional time-to-digital converter (TDC).

FIG. 9 illustrates an operation of a reference clock generating circuit according to an embodiment of the present disclosure.

DETAILED DESCRIPTION

The following detailed description references the accompanying figures in describing illustrative embodiments consistent with this disclosure. These embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 2:
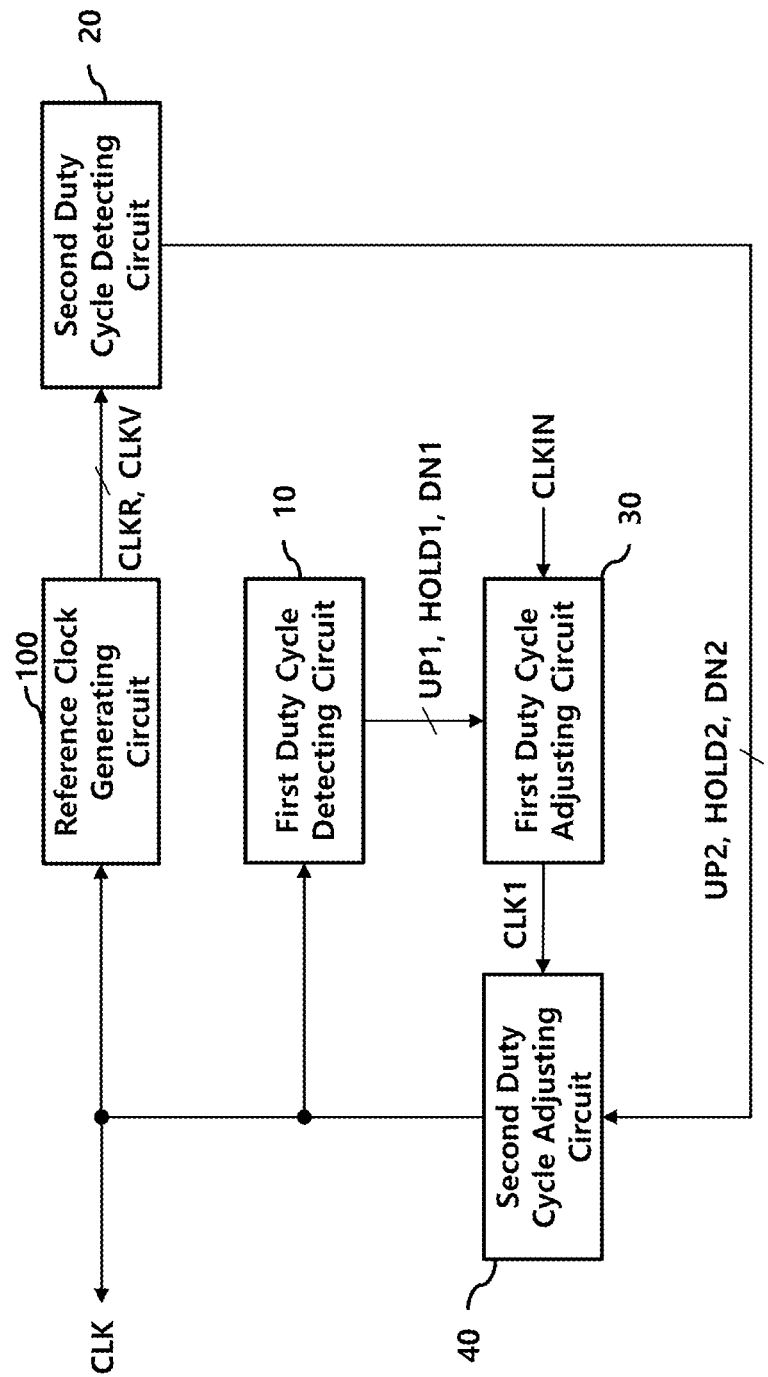
FIG. 2 illustrates a duty cycle correction circuit according to an embodiment of the present disclosure.

FIG. 2 is a block diagram illustrating a duty cycle correction circuit according to an embodiment of the present disclosure.

The duty cycle correction circuit includes a reference clock generating circuit 100, a first duty cycle detecting circuit 10, a second duty cycle detecting circuit 20, a first duty cycle adjusting circuit 30, and a second duty cycle adjusting circuit 40.

The first duty cycle adjusting circuit 30 adjusts a duty cycle of an input clock signal CLKIN according to first control signals to output a first clock signal CLKC.

In the embodiment of FIG. 2, the first control signals include a first rising signal UP1, a first holding signal HOLD1, and a first falling signal DN1.

The second duty cycle adjusting circuit 40 adjusts a duty cycle of the first clock signal CLKC according to second control signals to output the output clock signal CLK.

In this embodiment, the second control signals include a second rising signal UP2, a second holding signal HOLD2, and a second falling signal DN2.

The second duty cycle adjusting circuit 40 adjusts a duty cycle at a finer level than the first duty cycle adjusting circuit 30.

The first duty cycle detection circuit 10 detects a duty cycle of the output clock signal CLK and outputs the first control signals. The output clock signal CLK may be referred to as a clock signal CLK.

The second duty cycle detecting circuit 20 outputs second control signals using a signal output from the reference clock generating circuit 100.

The second duty cycle detecting circuit 20 detects a duty cycle at a finer level than the first duty cycle detecting circuit 10. For example, the second duty cycle detecting circuit 20 detects a duty cycle of the clock signal CLK with a resolution finer than that of the first duty cycle detecting circuit 10.

Figure 3:
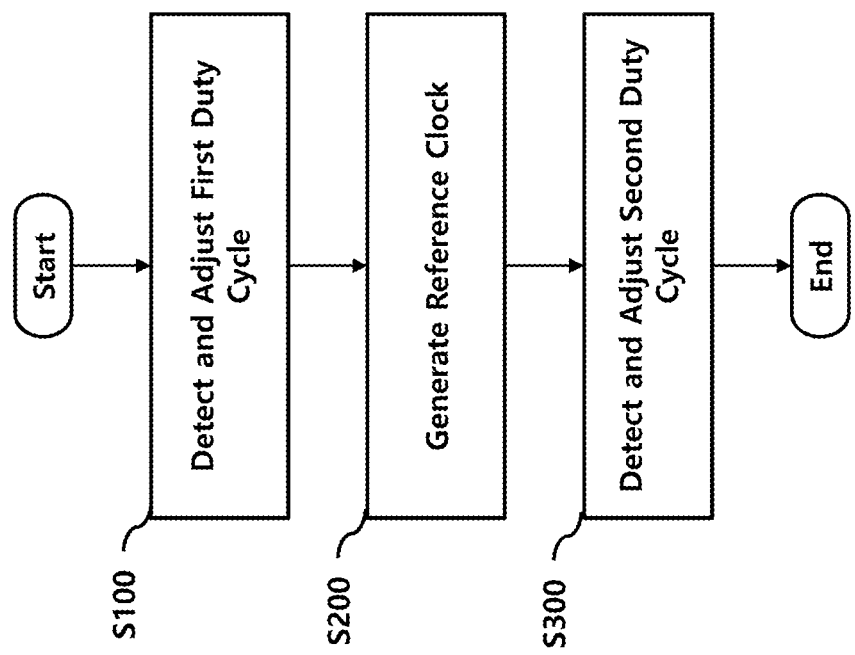
FIG. 3 illustrates an operation of a duty cycle correction circuit according to an embodiment of the present disclosure.

FIG. 3 is a flowchart illustrating an operation of a duty cycle correction circuit (e.g., the duty cycle correction circuit in FIG. 2) according to an embodiment of the present disclosure.

In the duty cycle correction circuit, the first duty cycle detecting circuit 10 and the first duty cycle adjusting circuit 30 operate at S100.

This reduces an error by a certain level, for example, 10% or less, before the second duty cycle adjusting circuit 40 operates.

Next, before the second duty cycle detecting circuit 20 operates, the reference clock generating circuit 100 first operates to generate a reference clock signal (e.g., the reference clock signal CLKR in FIG. 2) at S200.

Finally, the second duty cycle detecting circuit 20 and the second duty cycle adjusting circuit 40 operate at S300.

The second duty cycle detecting circuit 20 generates the second control signals using the reference clock signal CLKR and the clock signal CLK.

The second duty cycle adjusting circuit 40 operates according to the second control signals to precisely adjust the duty cycle.

As described above, in the conventional TDC, the wider the range of duty cycle of the input clock signal becomes, the higher the hardware cost increases.

In this embodiment of the present disclosure, hardware cost of the second duty cycle detecting circuit 20 can be reduced by reducing in advance a time difference between the clock signals (e.g., the reference clock signal CLKR and vernier clock signal CLKV) input to the second duty cycle detecting circuit 20 using the reference clock generating circuit 100.

Figure 4:
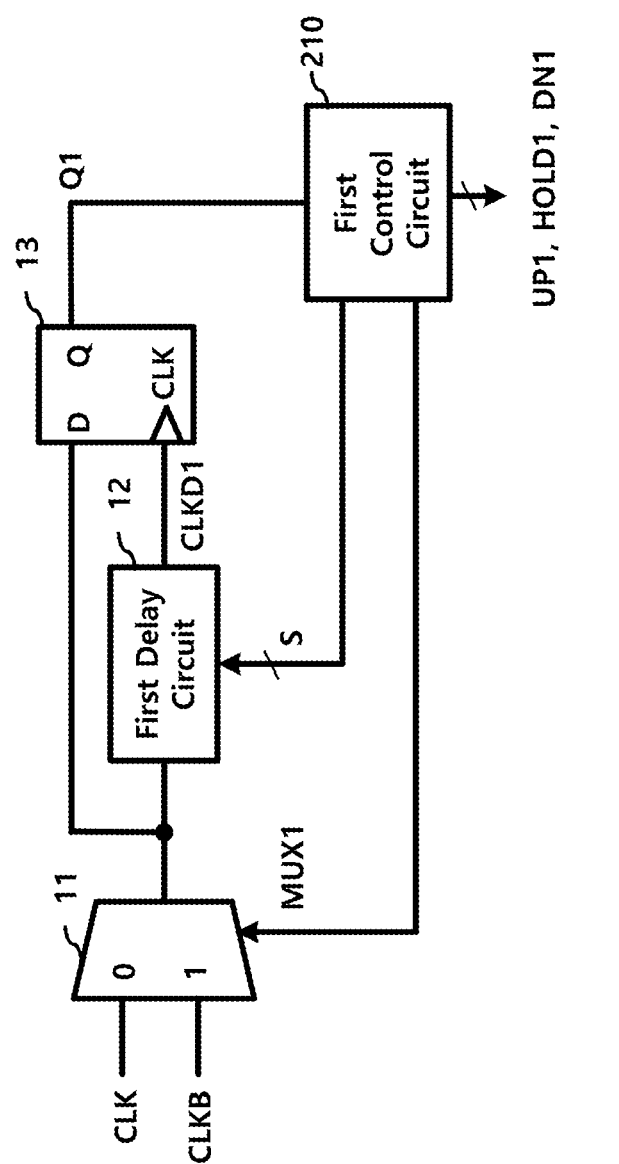
FIG. 4 illustrates a first duty cycle detecting circuit according to an embodiment of the present disclosure.

FIG. 4 is a block diagram illustrating a first duty cycle detecting circuit 10 according to an embodiment of the present disclosure.

The first duty cycle detecting circuit 10 includes a first selection circuit 11, a first variable delay circuit 12, a first flip-flop 13, and a first control circuit 210.

The first selection circuit 11 outputs the clock signal CLK or the inverted clock signal (or an inverted version of the clock signal) CLKB according to the first selection signal MUX1.

The first delay circuit 12 delays the output of the first selection circuit 11 according to the first delay control signal S to output the first delayed clock signal CLKD1.

In the embodiment of FIG. 4, the first delay control signal S is a multi-bit digital signal, and as its value increases, a delay amount of the first delay circuit 12 also gradually increases.

The first delay circuit 12 may be implemented as a digitally controlled delay line (DCDL). Since the configuration of DCDL is known, a detailed description thereof will be omitted for the interest of brevity.

For example, a delay amount of the first delay circuit 12 increases by a multiple of the minimum delay amount as the first delay control signal S increases.

The minimum delay amount may also be referred to as a resolution. In an embodiment, the minimum delay corresponds to a delay amount of two logic circuits (e.g., NAND gates).

The first flip-flop 13 provides the first output value Q1 by latching an output signal of the first selection circuit 11 in synchronization with an edge (e.g., a rising edge) of the first delayed clock signal CLKD1.

The first control circuit 210 performs a duty cycle detecting operation according to the first output value Q1 and provides the first control signals UP1, HOLD1, and DN1.

The first control circuit 210 adjusts the first selection signal MUX1 to alternately select the clock signal CLK or the delayed clock signal CLKB to detect the duty cycle.

Figure 5:
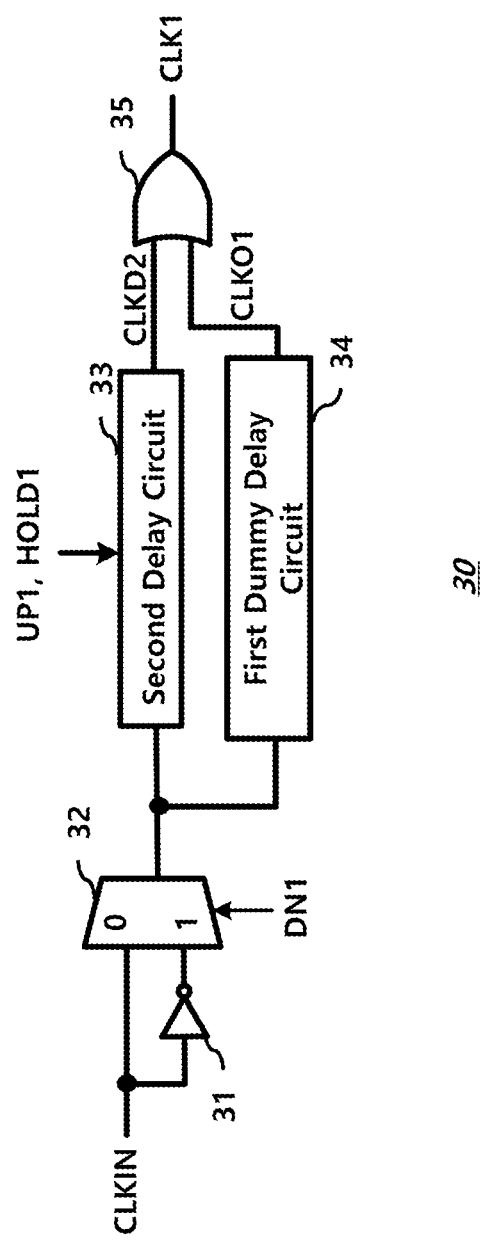
FIG. 5 illustrates a first duty cycle adjusting circuit according to an embodiment of the present disclosure.

FIG. 5 is a block diagram illustrating a first duty cycle adjusting circuit 30 according to an embodiment of the present disclosure.

The first duty cycle adjusting circuit 30 includes an inverter 31, a second selection circuit 32, a second delay circuit 33, a first dummy delay circuit 34, and a first logic circuit (e.g., OR gate) 35.

The inverter 31 inverts the input clock signal CLKIN.

The second selection circuit 32 selects the input clock signal CLKIN or the output of the inverter 31 according to the first down signal DN1 among the first control signals.

The second delay circuit 33 delays an output of the second selection circuit 32 according to the first up signal UP1 and the first hold signal HOLD1 among the first control signals to obtain a second delayed clock signal CLKD2.

The first dummy delay circuit 34 outputs the first dummy delayed clock signal CLKO1 by delaying an output of the second selection circuit 32 by a predetermined time.

The delay amount of the first dummy delay circuit 34 may correspond to the minimum delay amount of the second delay circuit 33.

The first OR gate 35 outputs the first clock signal CLK1 by performing an OR operation on the second delayed clock signal CLKD2 and the first dummy delayed clock signal CLKO1.

Figure 6:
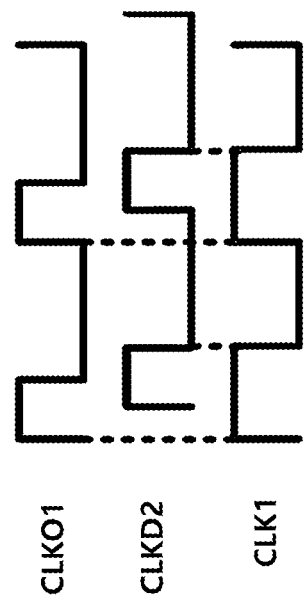
FIG. 6 illustrates an operation of a first duty cycle adjusting circuit according to an embodiment of the present disclosure.

FIG. 6 is a timing diagram for explaining an operation of the first duty cycle adjusting circuit 30 according to an embodiment of the present disclosure.

In the embodiment of FIG. 6, through the OR operation of the first OR gate 35, the first clock signal CLK1 rises in synchronization with a rising edge of the first dummy delayed clock signal CLKO1, and falls in synchronization with a falling edge of the second delayed clock signal CLKD2.

Since the first dummy delayed clock signal CLKO1 is fixed with the predetermined delay amount, a duty cycle of the first clock signal CLK1 varies according to the delay amount of the second delayed clock signal CLKD2, and accordingly, a duty cycle of the output clock signal CLK, that is, the clock signal CLK can be adjusted.

For example, when a delay amount of the second delay circuit 33 increases, a duty cycle of the first clock signal CLK1 increases.

When the first falling signal DN1 is activated, the second selection circuit 32 selects the inverted version of the input clock signal CLKIN. In this case, a duty cycle of the first clock signal CLK1 is an inverse of the previous duty cycle.

Figure 7:
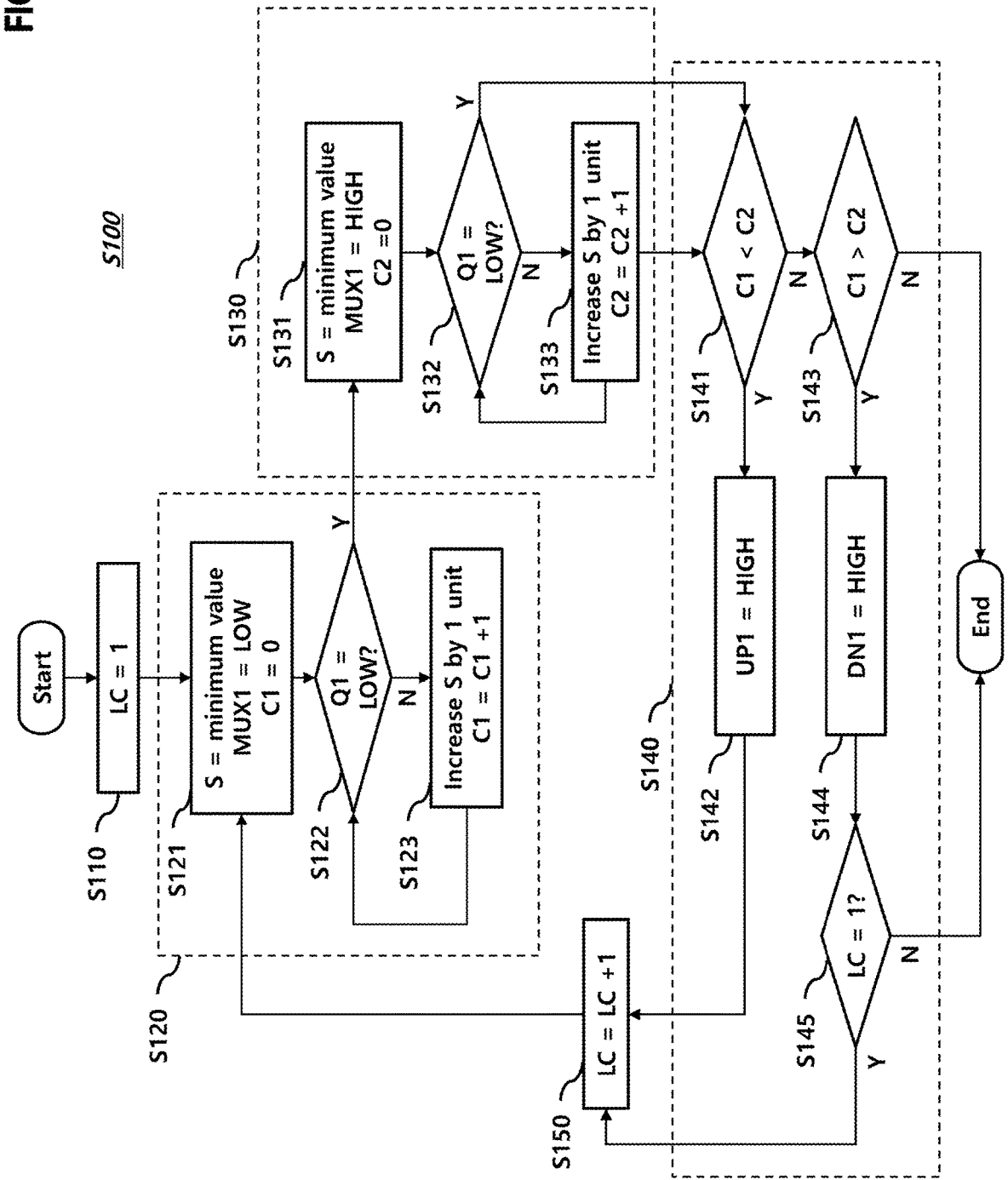
FIG. 7 illustrates an operation of a first duty cycle detecting circuit according to an embodiment of the present disclosure.

FIG. 7 is a flowchart illustrating an operation of the first duty cycle detecting circuit 10, and an operation illustrated in FIG. 7 may be performed by the first control circuit 210.

First, a loop count LC is initialized to a given value (e.g., 1) at S110.

Next, a first duty cycle is measured at S120.

In the embodiment of FIG. 7, a first duty cycle corresponds to a time interval in which the clock signal CLK is at a first value (e.g., a high level).

To this end, variables are initialized at S121. First, a first delay control signal S is set to a minimum value, a first selection signal MUX1 is set to a low level, and a first variable C1 is initialized to zero.

Accordingly, the clock signal CLK is input as a data signal of the first flip-flop 13, and the first delayed clock signal CLKD1 corresponding to a delayed version of the clock signal CLK is input as a clock signal of the first flip-flop 13.

Next, it is determined whether a first output value Q1 of the first flip-flop 13 is low at S122.

When the first output value Q1 is not low, the first delay control signal S is increased by one unit and a value of the first variable C1 is increased by 1 at S123.

If the first output value Q1 is low, it moves to the next step.

In this case, a value of the first variable C1 is a value corresponding to the first duty cycle.

Next, a second duty cycle is measured at S130.

In the embodiment of FIG. 7, the second duty cycle corresponds to a time interval in which the clock signal CLK is at a second value (e.g., the low level).

To this end, variables are initialized at S131. First, the first delay control signal S is set to a minimum value, the first selection signal MUX1 is set to a high level, and the second variable C2 is initialized to zero.

Accordingly, the inverted clock signal CLKB is input as a data signal of the first flip-flop 13, and the first delayed clock signal CLKD1 corresponding to a delayed version of the inverted clock signal CLKB is applied as a clock signal of the first flip-flop 13.

Next, it is determined whether the first output value Q1 of the first flip-flop 13 is low at S132.

When the first output value Q1 is not low, the first delay control signal S is increased by one unit and a value of the second variable C2 is increased by 1 at S133.

If the first output value Q1 is low, it moves to the next step.

In this case, a value of the second variable C2 is a value corresponding to the second duty cycle.

Next, the first duty cycle control circuit 30 is controlled by comparing the measured duty cycles.

First, it is determined whether the first variable C1 is smaller than the second variable C2 at S141.

If the first variable C1 is smaller than the second variable C2, the first rising signal UP1 is set to the high level.

Accordingly, the delay amount of the second delay circuit 33 increases, the second clock signal CLKD2 retreats, and as a result, the first duty cycle of the clock signal CLK increases.

Thereafter, the loop count LC is increased at S150, and the process returns to the step S120 and the above-described operations are repeated.

If the first variable C1 is not smaller than the second variable C2, it is determined whether the first variable C1 is greater than the second variable C2 at S143.

If the first variable C1 is greater than the second variable C2, the first falling signal DN1 is set to a high level.

When the first falling signal DN1 is set to the high level, the inverted version of the input clock signal CLKIN is selected by the second selection circuit 32 instead of the input clock signal CLKIN in FIG. 5.

As a result, a phase of the clock signal CLK is inverted.

Since the first duty cycle is large before the phase inversion, the second duty cycle becomes large as a result of the phase inversion. For example, since the first duty cycle is greater than the second duty cycle before the phase inversion, the first falling signal DN1 is set to the high level to cause the phase inversion, thereby increasing the second duty cycle of the clock signal CLK.

Next, it is determined whether the loop count LC is 1 at S145.

If the loop count is 1, since a duty cycle needs to be additionally adjusted, the process proceeds to step S150 and the above-described operations are repeated.

If the loop count LC is not 1, it is determined that a difference between the first duty cycle and the second duty cycle is less than a resolution of the first duty cycle detecting circuit 10 and the operation is terminated.

When the first variable C1 is not greater than the second variable C2 at S143, the first duty cycle and the second duty cycle are substantially the same and the operation is terminated. For example, the first duty cycle and the second duty cycle are substantially the same when the difference between the first duty cycle and the second duty cycle is less than the resolution of the first duty cycle detecting circuit 10.

When the first variable C1 and the second variable C2 are the same, the first holding signal HOLD1 may be set to the high level.

When the operation is finished, an operation of the reference clock generating circuit 100 starts as described above.

Figure 8:
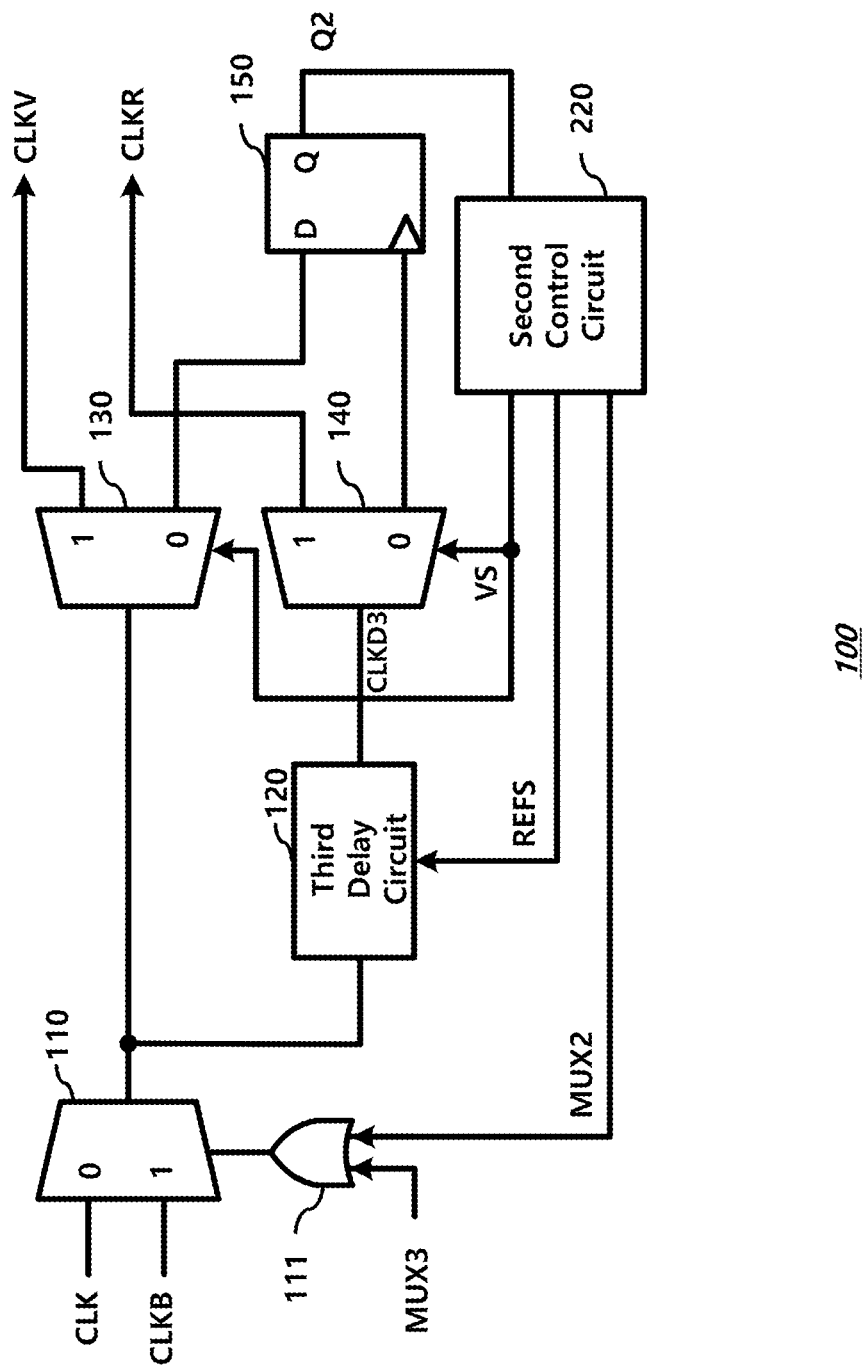
FIG. 8 illustrates a reference clock generating circuit according to an embodiment of the present disclosure.

FIG. 8 is a block diagram illustrating a reference clock generating circuit 100 according to an embodiment of the present disclosure.

The reference clock generating circuit 100 includes a third selection circuit 110 for selecting the clock signal CLK or the inverted clock signal CLKB, a third delay circuit 120 that outputs a third delayed clock signal CLKD3 by delaying an output of the third selection circuit 110, a first demux 130 for setting an output path of the third selection circuit 110, a second demux 140 for setting an output path of the third delay circuit 120, and a second flip-flop 150.

The first demux 130 and the second demux 140 set an output path according to a path signal VS.

The path signal VS has the high level when the second duty cycle detecting operation is started, and has the low level otherwise.

Accordingly, during the reference clock generating operation, the output of the first demux 130 is provided as a data signal of the second flip-flop 150, and the output of the second demux 140 is provided as a clock signal of the second flip-flop 150.

When the second duty cycle detecting operation is started, outputs of the first demux 130 and the second demux 140 are provided to the second duty cycle detecting circuit 20.

In this case, an output of the first demux 130 is referred to as a vernier clock signal CLKV, and an output of the second demux 140 is referred to as a reference clock signal CLKR.

The reference clock generating circuit 100 further includes a second control circuit 220 that outputs the path signal VS for controlling the first demux 130 and the second demux 140 according to an output of the second flip-flop 150 and the delay control signal REFS for controlling the third delay circuit 120.

The reference clock generating circuit 100 may further include a logic circuit 111 providing a selection signal of the third selection circuit 110.

The logic circuit 111 is an OR gate that performs an OR operation on the second selection signal MUX2 and the third selection signal MUX3.

The second selection signal MUX2 is provided from the second control circuit 220 and the third selection signal MUX3 is provided from a third control circuit (e.g., the third control circuit 230 in FIG. 11) for controlling an operation of the second duty cycle detecting circuit 20.

The third selection signal MUX3 is fixed to the low level while the reference clock signal CLKR is determined, and the second selection signal MUX2 is fixed to the low level while the second duty cycle detecting circuit 20 is operating.

FIG. 9 is a flowchart illustrating an operation of the reference clock generating circuit 100 according to an embodiment.

The operation of FIG. 9 may be controlled by the second control circuit 220.

First, an initialization operation is performed at S210.

In the initialization operation, the first variable REFC1 and the second variable REFC2 are initialized to 0, and the path signal VS is initialized to the low level.

Accordingly, the outputs of the first decoder 130 and the second decoder 140 are provided to the flip-flop 150.

Next, the first time interval measuring step at S220 is performed.

In the first time interval measuring step, a phase difference between the third delayed clock signal CLKD3 and the clock signal CLK is measured.

In this embodiment, a time difference between a first edge (e.g., the rising edge) of the third delayed clock signal CLKD3 and a second edge (e.g., the falling edge) of the clock signal CLK is measured.

For the first time interval measurement, variables are first initialized at S221.

The second selection signal MUX2 is set to the low level and the delay control signal REFS is initialized to 0.

Accordingly, the selection circuit 110 outputs the clock signal CLK.

The clock signal CLK is input as a data signal of the second flip-flop 150 through the first demux 130.

The clock signal CLK is delayed by the third delay circuit 120. The third delayed clock signal CLKD3 output from the third delay circuit 120 is input as a clock signal of the second flip-flop 150 through the second demux 140.

Figure 10A:
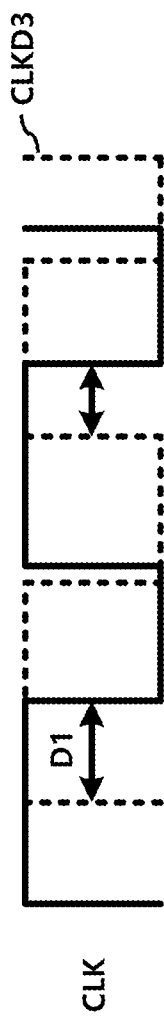
FIGS. 10A and 10B illustrate an operation of a reference clock generating circuit according to an embodiment of the present disclosure.
Figure 10B:
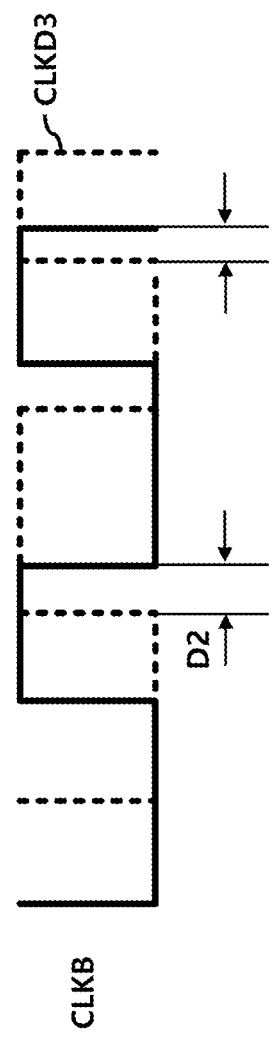

FIGS. 10A and 10B are waveform diagrams illustrating an operation of the reference clock generating circuit 100 according to an embodiment.

In FIG. 10A, the solid line indicates the clock signal CLK output from the first decoder 110, and the dotted line indicates the third delayed clock signal CLKD3 output from the second decoder 140.

The second output value Q2 of the second flip-flop 150 corresponds to a value of the clock signal CLK at a rising edge of the third delayed clock signal CLKD3.

It is determined whether the second output value Q2 is high at S222.

When the second output value Q2 is high, the delay control signal REFS is increased and the increased value is stored as the first variable REFC1 at S223. Accordingly, a delay amount of the third delayed clock signal CLKD3 increases.

If the second output value Q2 is not high, the first time interval measuring step is ended.

The first time interval measured at the first time interval measuring step S220 may correspond to an on-time duration of the clock signal CLK and a digital value corresponding to is stored as the first variable REFC1.

Next, a second time interval measuring step S230 is performed.

In the second time interval measuring step, a time difference between the third delayed clock signal CLKD3 and the inverted clock signal CLKB is measured.

In this embodiment, a time difference between a rising edge of the third delayed clock signal CLKD3 and a falling edge of the inverted clock signal CLKB is measured.

For the second time interval measurement, a variable is first initialized at S231.

The second selection signal MUX2 is set to the high level and the delay control signal REFS is initialized to 0.

Accordingly, the third selection circuit 110 outputs the inverted clock signal CLKB.

The inverted clock signal CLKB is input as a data signal of the second flip-flop 150 through the first demux 130.

The inverted clock signal CLKB is delayed by the third delay circuit 120. The third delayed clock signal CLKD3 output from the third delay circuit 120 is input as a clock signal of the second flip-flop 150 through the second demux 140.

In FIG. 10B, a solid line indicates an inverted clock signal CLKB output from the first demux 110, and a dotted line indicates a third delayed clock signal CLKD3 output from the second multiplexer 140.

The second output value Q2 of the second flip-flop 150 corresponds to the value of the inverted clock signal CLKB at the rising edge of the third delayed clock signal CLKD3.

It is determined whether the second output value Q2 is high at S232.

When the second output value Q2 is high, the delay control signal REFS is increased and the increased value is stored as the second variable REFC2 at S233. Accordingly, a delay amount of the third delayed clock signal CLKD3 increases.

If the second output value Q2 is not high, the second time measurement step is ended.

The second time interval measured at the second time interval measuring step S230 may correspond to an on-time duration of the inverted clock signal CLKB, which is an off-time duration of the clock signal CLK, and a digital value corresponding thereto is stored as the second variable REFC2.

Next, a delay control signal determination step S240 is performed.

To this end, the previously measured first time interval D1 and the second time interval D2 are compared. The first time interval corresponds to the first variable REFC1 and the second time interval corresponds to the second variable REFC2.

The first variable REFC1 is compared with the second variable REFC2 at S241.

If the first variable REFC1 is greater than or equal to the second variable REFC2, the delay control signal REFS is set to a value smaller than the second variable REFC2 by 1 at S242; otherwise, the delay control signal REFS is set to a value smaller than the first variable REFC1 by 1 at S243.

That is, the delay control signal REFS is determined as a value corresponding to the smaller duration of the first time interval and the second time interval. Specifically, the delay control signal REFS is determined such that the value of the delay control signal REFS minimizes a first phase difference or a second phase difference, the first phase difference between a first edge (e.g., a rising edge) of the reference clock signal CLKR and a second edge (e.g., a falling edge) of the clock signal CLK, the second phase difference between the first edge of the reference clock signal CLKR and a second edge of the inverted clock signal CLKB. For example, when the first variable REFC1 indicating the first time interval is greater the second variable REFC2 indicating the second time interval, the delay control signal REFS is determined as REFC2-1, thereby delaying the reference clock signal CLKR by a given amount corresponding to the determined delay control signal REFC2-1, the given amount being obtained by subtracting a unit delay amount of the third delay circuit 120 from the second time interval. As a result, the second phase difference between the rising edge of the reference clock signal CLKR and the falling edge of the inverted clock signal CLKB may be minimized to reduce the circuit area of the second duty cycle detecting circuit 20.

In the step S250, the second selection signal MUX2 is set to the low level and the path signal VS is set to the high level.

Accordingly, the first demux 130 outputs the output of the third selection circuit 110 as the vernier clock signal CLKV, and the second demux 140 uses the third delayed clock signal CLKD3 as the reference clock signal CLKR.

The second duty cycle detecting circuit 20 precisely detects the duty cycle of the clock signal CLK using the vernier clock signal CLKV and the reference clock signal CLKR.

According to this operation, a phase difference between the reference clock signal CLKR and the vernier clock signal CLKV is reduced to a sufficient level, so that the circuit area of the second duty cycle detecting circuit 20 is not excessively increased.

Figure 11:
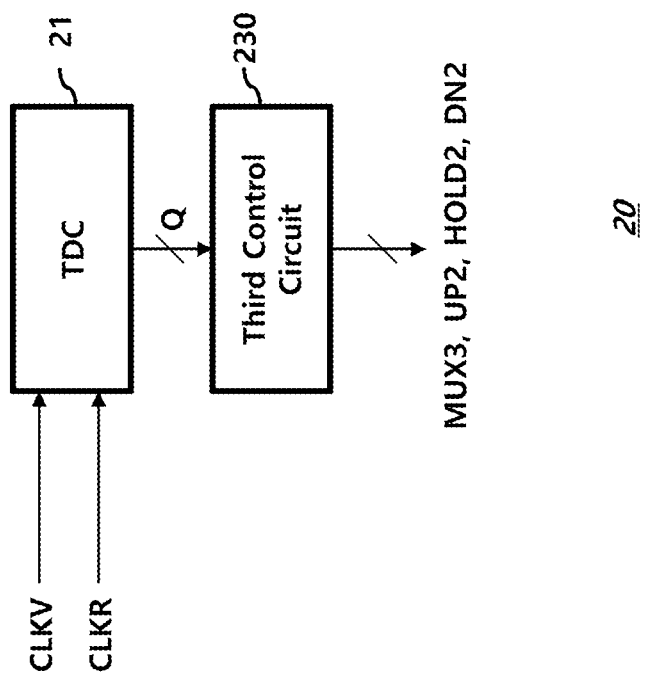
FIG. 11 illustrates a second duty cycle detecting circuit according to an embodiment of the present disclosure.

FIG. 11 is a block diagram illustrating a second duty cycle detecting circuit 20 according to an embodiment of the present disclosure.

The second duty cycle detecting circuit 20 includes a TDC 21 and a third control circuit 220.

The TDC 21 measures a phase difference between the two signals in a finer range using the reference clock signal CLKR and the vernier clock signal CLKV provided from the reference clock generating circuit 100.

Figure 12:
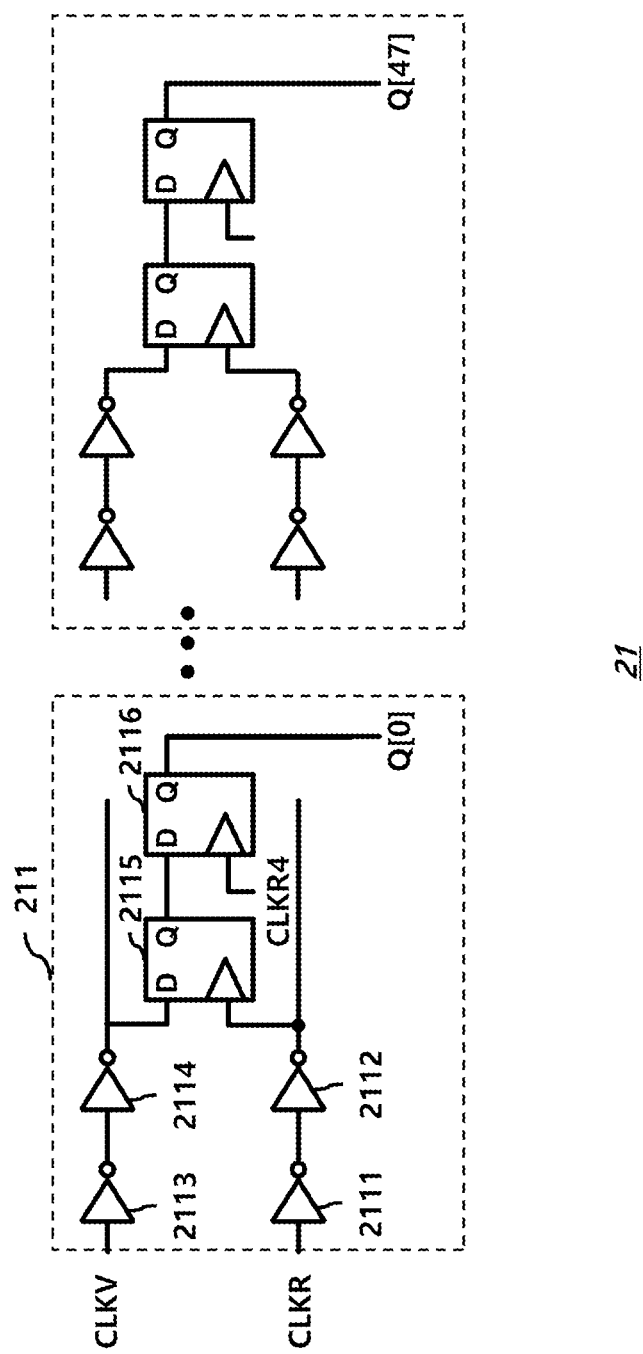
FIG. 12 illustrates a TDC according to an embodiment of the present disclosure.

FIG. 12 is a circuit diagram showing the TDC 21 according to an embodiment of the present disclosure.

The TDC 21 includes a first delay line in which the reference clock signal CLKR is sequentially delayed and a second delay line in which the vernier clock signal CLKV is sequentially delayed.

In this embodiment, the TDC 21 includes a plurality of unit conversion circuits 211 connected along the first delay line and the second delay line.

The unit conversion circuit 211 includes two inverters 2111 and 2112 for delaying the reference clock signal CLKR input through the first delay line, two inverters 2113 and 2114 for delaying the vernier clock signal CLKV input through the second delay line, a flip-flop 2115 for latching an output of the inverter 2114 in synchronization with an output of the inverter 2112, and a flip-flop 2116 for latching an output of the flip-flop 2115 in synchronization with a clock signal CLKR4 obtained by dividing the reference clock signal CLKR by 4. A corresponding bit Q[0] of the phase difference signal Q is output from the flip-flop 2116.

A phase difference signal Q is generated according to a phase difference between the reference clock signal CLKR and the vernier clock signal CLKV applied to the TDC 21.

The vernier clock signal CLKV corresponds to the clock signal CLK or the inverted clock signal CLKB, and the reference clock signal CLKR corresponds to a delayed signal.

Since a phase difference between the reference clock signal CLKR and the vernier clock signal CLKV is reduced to a sufficient level by the operation of the reference clock generating circuit 100, the circuit complexity of the TDC 21 may be reduced compared to that of a conventional TDC.

The third control circuit 230 controls the second duty cycle adjusting circuit 20 while outputting the second control signals UP2, HOLD2, and DN2 according to the phase difference signal Q output from the TDC 21.

The third control circuit 230 may provide the third selection signal MUX3 to control the third selection circuit 110 of the reference clock generating circuit 100.

Figure 13:
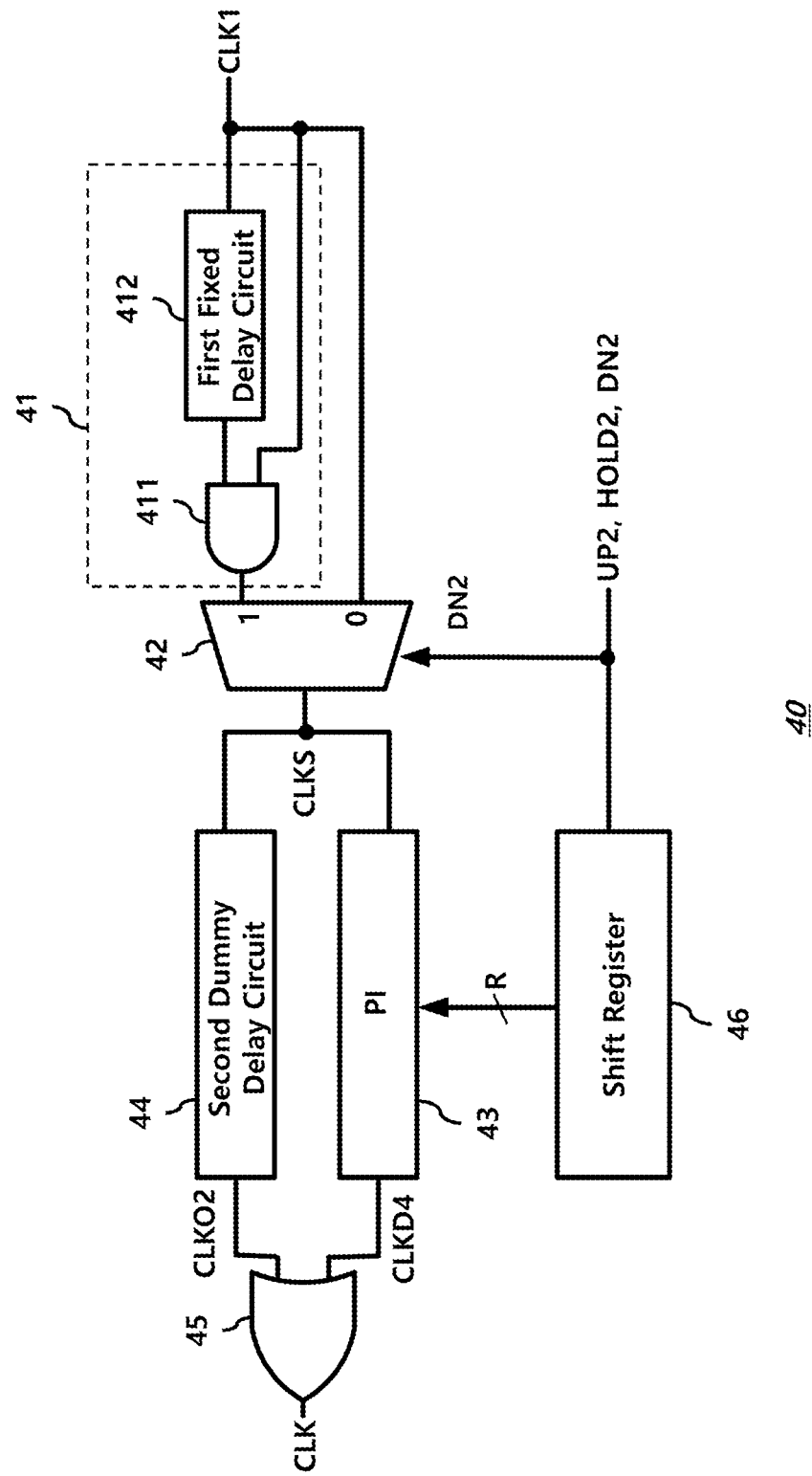
FIG. 13 illustrates a second duty cycle adjusting circuit according to an embodiment of the present disclosure.

FIG. 13 shows a second duty cycle adjusting circuit 40 according to an embodiment of the present disclosure.

The second duty cycle adjusting circuit 40 includes a pulse generating circuit 41, a third selection circuit 42, a phase interpolator (PI) circuit 43, a second dummy delay circuit 44, and a second OR gate 45, and a shift register 46.

The PI circuit 43 may be referred to as a fourth delay circuit 43.

The pulse generating circuit 41 includes an AND gate 411 and a first fixed delay circuit 412. The AND gate 411 performs an AND operation on the first clock signal CLK1 and an output of the first fixed delay circuit 412. The first fixed delay circuit 412 delays the first clock signal CLK1 by a predetermined delay amount.

The pulse generating circuit 41 reduces the high level section of the clock signal CLK1 by a delay amount of the first fixed delay circuit 412 to generate a signal with a reduced duty cycle as a result.

At this time, a delay amount of the first fixed delay circuit 412 is a delay amount corresponding to the resolution of the first duty cycle detecting circuit 10, and in an embodiment, the delay amount may correspond to that of two NAND gates.

The third selection circuit 42 outputs the first clock signal CLK1 or an output of the pulse generating circuit 41 according to the second falling signal DN2. An output signal of the third selection circuit 42 is indicated as a selection clock signal CLKS.

The shift register 46 increases, maintains, or decreases the magnitude of the shift register signal R according to the second control signals UP2, HOLD2, and DN2.

The second OR gate 45 performs an OR operation on the fourth delayed clock signal CLKD4 output from the PI circuit 43 and the second dummy delayed clock signal CLKO2 output from the second dummy delay circuit 44 to generate a clock signal CLK.

The PI circuit 43, the second dummy delay circuit 44, and the second OR gate 45 correspond to the second delay circuit 33, the first dummy delay circuit 34, and the first OR gate 35 of the first duty cycle adjusting circuit 30 shown in FIG. 5 and they have similar operation principles.

That is, the second OR gate 45 finely adjusts a duty cycle of the clock signal CLK according to the shift register signal R.

In this embodiment, the PI circuit 43 adjusts a phase of the selection clock signal CLKS according to the shift register signal R output from the shift register 46.

Range of the adjusted phase corresponds to a delay amount of the first fixed delay circuit 412 described above.

Figure 14:
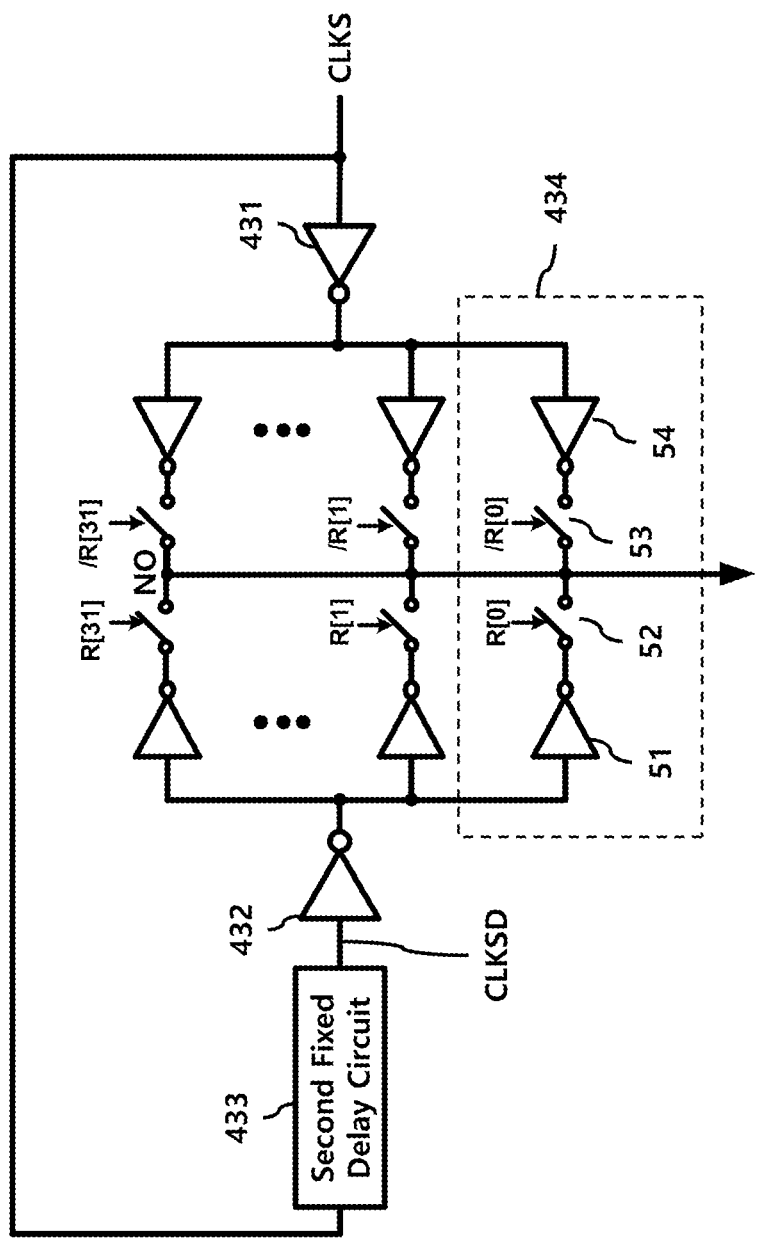
FIG. 14 illustrates a phase interpolator (PI) circuit according to an embodiment of the present disclosure.

FIG. 14 shows the PI circuit 43 according to an embodiment.

The PI circuit 43 includes an inverter 431 for inverting the selection clock signal CLKS, the second fixed delay circuit 433 for delaying the selection clock signal CLKS, and an inverter 432 for delaying an output of the second fixed delay circuit 433.

A delay amount of the second fixed delay circuit 433 corresponds to a resolution of the first duty cycle detecting circuit 10, which in this embodiment corresponds to two NAND gates.

An output of the second fixed delay circuit 433 is referred as a delay selection clock signal CLKSD.

The PI circuit 43 includes a plurality of switching circuits 434 connected in parallel between output terminals of the two inverters 431 and 432.

One switching circuit 434 is controlled according to a corresponding bit of the shift register signal R which is a multi-bit signal.

The switching circuit 434 includes an inverter 54 and a switch 53 serially connected between the inverter 431 and the output node NO, and an inverter 51 and a switch 52 serially connected between the inverter 432 and the output node NO.

At this time, since the switch 52 is controlled by the shift register signal R[0] and the switch 53 is controlled by the shift register signal /R[0], only one of the two switches 52 and 53 is turned on.

By the operation of the switching circuit 434, the PI circuit 43 finely adjusts the duty cycle in a range of a delay amount of the second fixed delay circuit 433 according to the shift register signal R.

Figure 15:
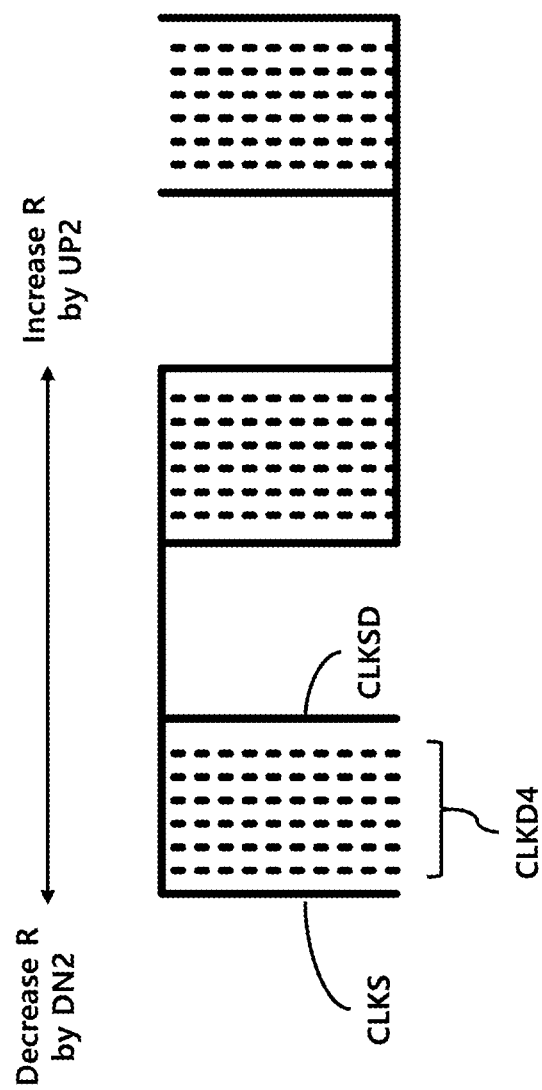
FIG. 15 illustrates an operation of a PI circuit according to an embodiment of the present disclosure.

FIG. 15 is a waveform diagram illustrating an operation of the PI circuit 43 according to an embodiment.

As the magnitude of the shift register signal R decreases by the second falling signal DN2, phase of the fourth delayed clock signal CLKD4 output from the PI circuit 43 approaches the selection clock signal CLKS, and as the magnitude of the shift register signal R increases by the second rising signal UP2, phase of the fourth clock signal CLKD4 approaches the delay selection clock signal CLKSD.

The second dummy delay circuit 44 has a delay amount corresponding to the minimum delay amount of the PI circuit 43.

Accordingly, the second dummy delay circuit 44 may have the same configuration as the PI circuit 43 to which the shift register signal R of the minimum value is input.

Similarly to the operation as described with reference to FIG. 6, as a delay amount of the PI circuit 43 increases, a duty cycle of the clock signal CLK increases due to the operation of the second OR gate 45, and as a delay amount of the PI circuit 43 decreases, a delay amount of the PI circuit 43 decreases.

As described above, the second duty cycle adjusting circuit 40 adjusts a duty cycle of the clock signal CLK in a fine range.

Figure 16:
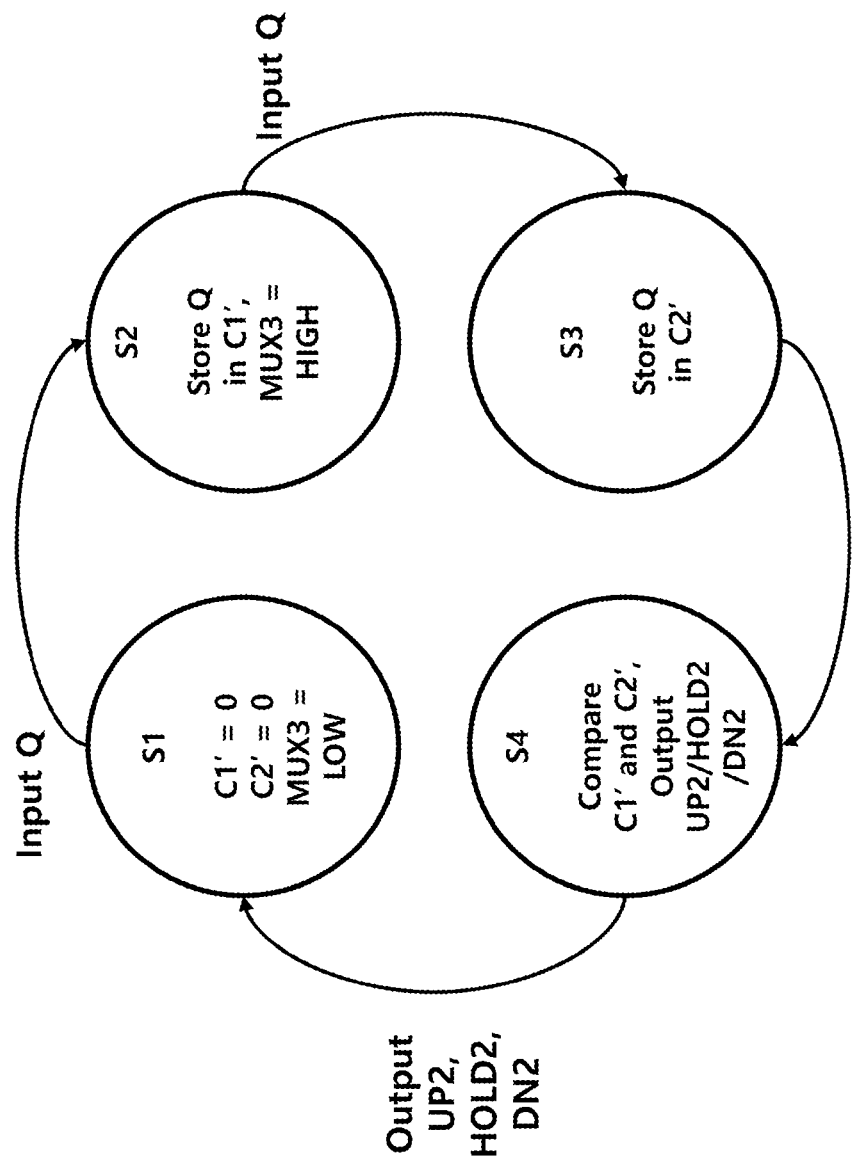
FIG. 16 illustrates an operation of a second duty cycle detecting circuit according to an embodiment of the present disclosure.

FIG. 16 is a state diagram illustrating an operation of the second duty cycle detecting circuit 20, which may be controlled by the third control circuit 230.

In the first state S1, the variables C1' and C2' are initialized and the third selection signal MUX3 is set to the low level.

Accordingly, the vernier clock signal CLKV applied to the TDC 21 corresponds to the clock signal CLK.

When the phase difference signal Q is input from the TDC 21, the first state S1 transitions to the second state S2.

In the second state S2, a value of the phase difference signal Q is stored as the first variable C1' and then the third selection signal MUX3 is set to the high level.

Accordingly, the vernier clock signal CLKV applied to the TDC 21 corresponds to the inverted clock signal CLKB.

When phase difference signal Q is input from the TDC 21, the second state S2 transitions to the third state S3.

In the third state S3, a value of the phase difference signal Q is stored as the second variable C2' and then the third state S3 transitions to the fourth state S4.

In the fourth state S4, values of the first variable C1' and the second variable C2' are compared.

The operations at the fourth state S4 may be understood similarly to those at the step S140 of FIG. 7 as will be described below.

When the first variable C1' and the second variable C2' are the same, the second hold signal HOLD2 is set to the high level.

Since the smaller first variable C1' means that the duty cycle is small, the second rising signal UP2 is set to the high level. For example, when the first variable C1' is smaller than the second variable C2', the second rising signal UP2 is set to the high level.

Since the greater the first variable C1' means that the duty cycle is greater, the second falling signal DN2 is set to the high level. For example, when the first variable C1' is greater than the second variable C2', the second falling signal DN2 is set to the high level.

In this case, in the case of the first loop, it returns to the first state S1 and repeats the above-described operation.

Otherwise, the second hold signal HOLD2 signal is set to the high level.

In an embodiment, when the second holding signal HOLD2 signal is repeated a certain number of times (for example, 4 times), the second duty cycle adjusting operation is stopped, and if not, the fourth state S4 transitions to the first state S1 and operation as described above can be repeated.

In the above-described embodiments, the first control circuit 210 is included in the first duty cycle detecting circuit 10, the second control circuit 220 is included in the reference clock generating circuit 100, and the third control circuit 230 is included in the second duty cycle detecting circuit 20.

In another embodiment, the first control circuit 210, the second control circuit 220, and the third control circuit 230 may be separated into separate control circuits.

Although various embodiments have been illustrated and described, various changes and modifications may be made to the described embodiments without departing from the spirit and scope of the invention as defined by the following claims.

What is claimed is:

1. A duty cycle correction circuit, comprising:
   a first duty cycle detecting circuit configured to detect a duty cycle of a clock signal with a first resolution;
   a reference clock generating circuit configured to generate a reference clock signal by adjusting a phase of the clock signal;
   a second duty cycle detecting circuit configured to detect the duty cycle of the clock signal with a second resolution according to the reference clock signal and the clock signal, the second resolution being finer than the first resolution;
   a first duty cycle adjusting circuit configured to adjust the duty cycle of the clock signal according to one or more first control signals output from the first duty cycle detecting circuit; and
   a second duty cycle adjusting circuit configured to adjust the duty cycle of the clock signal according to one or more second control signals output from the second duty cycle detecting circuit.

2. The duty cycle correction circuit of claim 1, wherein the reference clock generating circuit generates the reference clock signal after the first duty cycle detecting circuit finishes an operation thereof, and
   wherein the second duty cycle detecting circuit begins an operation thereof after the reference clock signal is determined.

3. The duty cycle correction circuit of claim 1, wherein the first duty cycle detecting circuit measures a first time interval when the clock signal is at a first level and a second time interval when the clock signal is at a second level, and
   wherein the first duty cycle adjusting circuit adjusts the duty cycle of the clock signal so that a difference between the first time interval and the second time interval become less than the first resolution.

4. The duty cycle correction circuit of claim 3, wherein the first duty cycle detecting circuit includes:
   a first selection circuit configured to output the clock signal or an inverted clock signal corresponding to an inverted version of the clock signal;
   a first delay circuit configured to delay an output of the first selection circuit; and
   a first flip-flop configured to latch the output of the first selection circuit in synchronized with an output of the first delay circuit.

5. The duty cycle correction circuit of claim 4, wherein the first duty cycle adjusting circuit includes:
   a second selection circuit configured to output an input clock signal or an inverted input clock signal corresponding to an inverted version of the input clock signal;
   a second delay circuit configured to variably delay an output of the second selection circuit;
   a first dummy delay circuit configured to fixedly delay the output of the second selection circuit; and
   a logic circuit configured to perform a logical operation on outputs of the second delay circuit and the first dummy delay circuit.

6. The duty cycle correction circuit of claim 5, further comprises a first control circuit configured to control the first selection circuit and the first delay circuit to measure the first time interval and the second time interval, and to control the second selection circuit and the second delay circuit to control the duty cycle of the clock signal,
   wherein the first selection circuit selects the clock signal while measuring the first time interval, and selects the inverted clock signal while measuring the second time interval.

7. The duty cycle correction circuit of claim 1, wherein the reference clock generating circuit measures a first time interval when the clock signal is at a first level and a second time interval when the clock signal is at a second level, and generates the reference clock signal by delaying the clock signal with a given delay amount, the given delay amount corresponding to a smaller one of the first time interval and the second time interval.

8. The duty cycle correction circuit of claim 7, wherein the reference clock generating circuit includes:
   a third selection circuit configured to output the clock signal or an inverted clock signal corresponding to an inverted version of the clock signal;
   a third delay circuit configured to delay an output of the third selection circuit; and
   a second flip-flop configured to latch the output of the third selection circuit in synchronization with an output of the third delay circuit while determining a delay amount of the third delay circuit.

9. The duty cycle correction circuit of claim 8, wherein the reference clock generating circuit further includes a demux configured to provide an output of the third delay circuit to the second flip-flop while determining the delay amount of the third delay circuit, and to provide an output of the third delay circuit as the reference clock signal after the delay amount of the third delay circuit is determined.

10. The duty cycle correction circuit of claim 8, further comprises a second control circuit configured to control the third selection circuit and the third delay circuit to measure the first time interval and the second time interval according to an output of the second flip-flop, wherein the third selection circuit selects the clock signal while measuring the first time interval and selects the inverted clock signal while measuring the second time interval.

11. The duty cycle correction circuit of claim 10, wherein the second control circuit sequentially controls the delay amount of the third delay circuit by a unit delay amount, and
wherein the given delay amount corresponding to the smaller one of the first time interval and the second time interval is obtained by subtracting the unit delay amount from the smaller one.

12. The duty cycle correction circuit of claim 1, wherein the second duty cycle detecting circuit includes a time-to-digital converter (TDC) configured to detect a first phase difference between the clock signal and the reference clock signal and a second phase difference between an inverted clock signal and the reference clock signal, the inverted clock signal corresponding to an inverted version of the clock signal, and
wherein the second duty cycle adjusting circuit controls the duty cycle of the clock signal so that a difference between the first phase difference and the second phase difference become less than the second resolution.

13. The duty cycle correction circuit of claim 12, wherein the second duty cycle adjusting circuit includes:
a fourth selection circuit configured to output an output signal of the first duty cycle adjusting circuit or a pulse signal as a selection clock signal, the pulse signal having a duty cycle shorter than that of the output signal of the first duty cycle adjusting circuit by the first resolution;
a fourth delay circuit configured to variably delay the selection clock signal;
a second dummy delay circuit configured to fixedly delay the selection clock signal; and
a logic circuit configured to perform a logic operation on outputs of the fourth delay circuit and the second dummy delay circuit.

14. The duty cycle correction circuit of claim 13, wherein the second duty cycle adjusting circuit further includes:
a first fixed delay circuit configured to delay the output signal of the first duty cycle adjusting circuit; and
a logic circuit configured to perform a logic operation on an output of the first fixed delay circuit and the output signal of the first duty cycle adjusting circuit and to provide the pulse signal to the fourth selection circuit.

15. The duty cycle correction circuit of claim 13, further comprising a third control circuit configured to control the fourth selection circuit and the fourth delay circuit to adjust the duty cycle of the clock signal according to an output of the TDC.

16. The duty cycle correction circuit of claim 15, further comprising a shift register configured to output a shift register signal being adjusted according to the second control signals,
wherein the fourth delay circuit is a phase interpolator (PI) circuit whose delay is controlled according to the shift register signal.

17. The duty cycle correction circuit of claim 16, wherein the fourth delay circuit includes:
a second fixed delay circuit configured to delay the selection clock signal by a delay amount corresponding to the first resolution; and
a plurality of switching circuits,
wherein each of the plurality of switching circuits is controlled by a corresponding bit of the shift register signal and provides one of the selection clock signal and an output of the second fixed delay circuit to an output node.

18. The duty cycle correction circuit of claim 13, wherein the second dummy delay circuit has a delay amount corresponding to a minimum delay amount of the fourth delay circuit.

19. The duty cycle correction circuit of claim 1, wherein the reference clock generating circuit generates the reference clock signal by delaying the clock signal with a given delay amount, the given delay amount being sufficient to minimize a first phase difference or a second phase difference, the first phase difference between a first edge of the reference clock signal and a second edge of the clock signal, the second phase difference between the first edge of the reference clock signal and a third edge of an inverted version of the clock signal.

20. The duty cycle correction circuit of claim 19, wherein the first edge is a rising edge, and each of the second edge and the third edge is a falling edge.

* * * * *